(12) United States Patent
Harris

(10) Patent No.: US 6,287,952 B1
(45) Date of Patent: Sep. 11, 2001

(54) METHOD OF ETCHING SELF-ALIGNED VIAS TO METAL USING A SILICON NITRIDE SPACER

(75) Inventor: Edward Belden Harris, Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/473,876

(22) Filed: Dec. 28, 1999

(51) Int. Cl.[7] .................................................. H01L 21/4763
(52) U.S. Cl. ........................ 438/618; 438/637; 438/638; 438/639
(58) Field of Search ................................... 438/618–622, 438/637–639, 666, 700–702

(56) References Cited

U.S. PATENT DOCUMENTS

| | | | |
|---|---|---|---|
| 5,270,236 | 12/1993 | Rosner | 437/48 |
| 5,286,674 | * 2/1994 | Roth et al. | 438/700 |
| 5,352,630 | 10/1994 | Kim et al. | 437/195 |
| 5,382,545 | 1/1995 | Hong | 437/195 |
| 5,679,967 | 10/1997 | Janai et al. | 257/209 |
| 5,702,981 | * 12/1997 | Maniar et al. | 438/627 |
| 5,872,056 | * 2/1999 | Manning | 438/637 |
| 5,888,897 | 3/1999 | Liang | 438/622 |

* cited by examiner

*Primary Examiner*—David Nelms
*Assistant Examiner*—Dung A Le
(74) *Attorney, Agent, or Firm*—Schnader Harrison Segal & Lewis LLP

(57) ABSTRACT

A method for manufacturing integrated circuits uses a silicon nitride spacer for etching self-aligned vias. The method is accomplished by (1) providing a first inter-level dielectric layer having metal lines formed on it; (2) depositing a silicon nitride layer over the metal lines and the first inter-level dielectric layer; (3) depositing a second inter-level dielectric layer on the silicon nitride layer; (4) depositing a photoresist on that second inter-level dielectric layer; (5) patterning vias on that second inter-level dielectric layer; (6) non-selectively oxide etching the second inter-level dielectric layer and the silicon nitride layer to form the vias; and (7) selectively nitride-to-oxide etching the silicon nitride layer to remove the silicon nitride layer surrounding the metal lines, where the etching stops at the first inter-level dielectric layer. This forms an access window.

14 Claims, 2 Drawing Sheets

METHOD OF ETCHING SELF-ALIGNED VIAS TO METAL USING A SILICON NITRIDE SPACER

BACKGROUND OF THE INVENTION

1. Field of the Invention

This invention relates to a method of manufacturing semiconductor integrated circuit interconnect structures. The invention relates more particularly to a method for etching self-aligned vias to metal using a silicon nitride spacer.

2. Background of the Invention

Semiconductor integrated circuit devices typically comprise silicon and multiple layers of vertically stacked metal interconnect layers with dielectric materials disposed between them. The fabrication of such devices typically involves the repeated deposition or growth, patterning, and etching of thin films of semiconductor, metal, and dielectric materials.

Semiconductor devices generally include two or more metal layers separated and insulated by one or more dielectric layers. Typically, electrical communication is established between a plurality of locations on the metal layers.

To make contact between layers, a contact opening or via is formed in the dielectric layer above a first metal layer. Vias and contacts are generally formed by photolithography. A photoresist is deposited over the dielectric layer and patterned by transmitting radiation through a mask onto the resist. The resist is then developed creating patterning areas resistant to etching. Exposed areas of the underlying dielectric material are then etched. Areas etched through to the first metal layer form vias to the first metal layer.

Semiconductor integrated circuit devices have become more complex over the years. To prevent the devices from growing larger, the features that make up the devices have gotten smaller. With smaller feature sizes, it is more difficult to align one feature relative to another and to control size tolerance as a function of nominal feature size. To overcome this difficulty, manufacturers have incorporated self-alignment features. Self-alignment is a technique in which multiple levels of regions on a wafer are formed using a single mask, thereby eliminating alignment tolerances required by additional masks.

For certain applications, dielectric material, or a laser ablative etch resistant coating, is removed, or ablated, from the sides of metal lines, for example, to enable access to the metal for programming. Overlay alignment errors of the dielectric material may result in loss of chip space for programming.

Currently, a via photoresist is patterned with optical steppers and etched with a timed oxide etch. The alignment of the photoresist for these vias is therefore critical and not easily achieved with current stepper technology. Additionally, due to the variability of the ILD thickness and any alignment errors, the via etch must be timed accurately.

To overcome alignment difficulties, some manufacturers use a conductive landing pad in a metal line of the first metal layer. The conductive pad reduces the chances of short circuiting the second metal because it is wider than the minium metal line width to provide additional alignment tolerance. However, a landing pad increases the width of a portion of a metal line and limits contacted metal line density. Metal lines typically must be separated by a minium threshold distance in order to lithographically define and etch the space between adjacent metal lines and to prevent excessive capacitive coupling between adjacent lines.

Another self-alignment method is known, which includes forming a via out of part of a first spacer made of a first dielectric and surrounded by a second dielectric in a first sandwich structure; forming a second sandwich structure disposed on the first sandwich structure and having a second spacer of the first dielectric that is surrounded by a second insulating layer; removing the second spacer and a portion of the first spacer to form a first opening; and forming a conductive layer in the first opening to create an integrated structure. This integrated structure is subsequently filled with a conductive material and does not allow for further etching.

Conventional alignment methods may lead to nonuniform openings adjacent to metal lines and inadequate or varied via depth. Therefore, there is a need for an etching process that provides satisfactory uniform openings and adequate via depth control; and thereby overcomes alignment problems.

SUMMARY OF THE INVENTION

The invention is a method of manufacturing an integrated circuit including the steps of: (1) providing a first inter-level dielectric layer having metal lines formed thereon; (2) depositing a silicon nitride layer over the metal lines and the first inter-level dielectric layer; (3) depositing a second interlevel dielectric layer on the silicon nitride layer; (4) depositing a photoresist on the second inter-level dielectric layer; (5) patterning vias on the second inter-level dielectric layer; (6) non-selectively oxide etching the second inter-level dielectric layer and the silicon nitride layer to form the vias; and (7) selectively nitride-to-oxide etching the silicon nitride layer to remove the silicon nitride layer surrounding the metal lines, wherein the etching stops at the first inter-level dielectric layer, thereby forming an access window.

Another aspect of the invention is a semiconductor including a first inter-level dielectric layer having metal lines and portions of a silicon nitride layer formed thereon; portions of a second interlevel dielectric layer formed on the portions of the silicon nitride layer; vias patterned with a photoresist on the portions of the second inter-level dielectric layer; and openings within the vias to a top and sides of the metal lines, forming an access window.

DETAILED DESCRIPTION

The invention will be understood more fully from the detailed description given below, which however, should not be taken to limit the invention to a specific embodiment, but is for explanation and understanding only.

The invention is a method of manufacturing an integrated circuit including the steps of: (1) providing a first inter-level dielectric layer having metal lines formed thereon; (2) depositing a silicon nitride layer over the metal lines and the first inter-level dielectric layer; (3) depositing a second interlevel dielectric layer on the silicon nitride layer; (4) depositing a photoresist on the second inter-level dielectric layer; (5) patterning vias on the second inter-level dielectric layer; (6) non-selectively oxide etching the second inter-level dielectric layer and the silicon nitride layer to form the vias; and (7) selectively nitride-to-oxide etching the silicon nitride layer to remove the silicon nitride layer surrounding the metal lines, wherein the etching stops at the first inter-level dielectric layer, thereby forming an access window.

Figure 1:
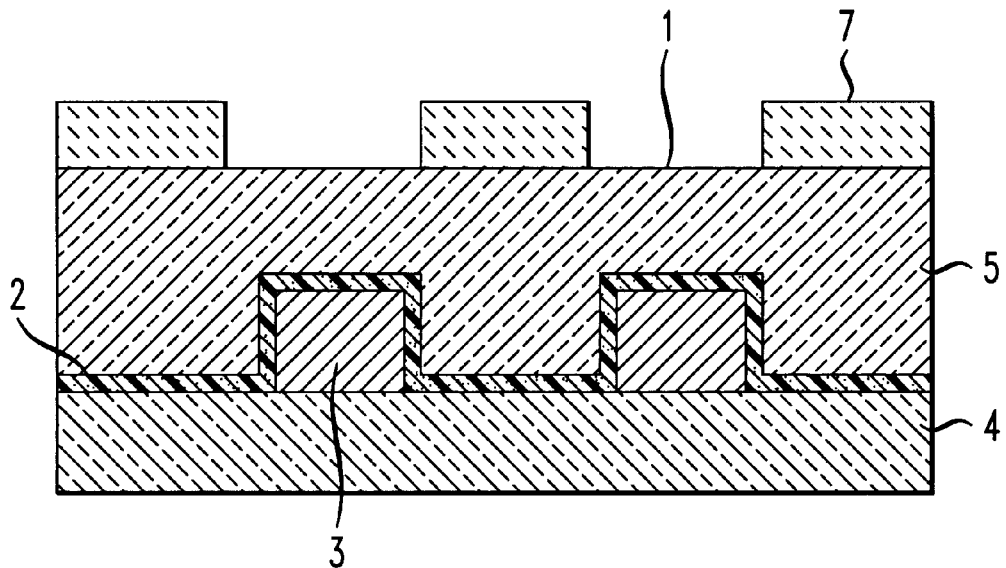
FIG. 1 is a cross-sectional view of a portion of an integrated circuit manufactured in accordance with steps 1–5 of the invention.

FIGS. 1 through 4 illustrate an embodiment of the method of the invention. Referring to FIG. 1, a silicon nitride layer 2 is deposited over a first inter-level dielectric layer 4 having metal lines 3 deposited thereon. For aluminum metal lines, plasma-enhanced chemical vapor deposition is preferred for depositing silicon nitride layer 2 because it can be performed at a temperature below 450° C., the maximum temperature of which aluminum can withstand. However, other applicable methods and techniques may be used to form silicon nitride layer 2. Metal lines 3 are preferably aluminum, copper, aluminum alloys, copper alloys, titanium, titanium alloys, or mixtures thereof. Particularly preferred are metal lines of aluminum, titanium nitride stacks. First inter-level dielectric layer 4 is preferably silicon dioxide because silicon dioxide has a low dielectric constant and a selective etch of silicon nitride may be obtained. However, it is to be appreciated that other dielectrics that can be selectively etched may be used. A second inter-level dielectric layer 5, preferably a silicon dioxide layer, is deposited over silicon nitride layer 2 and preferably chemical mechanical polished. Second inter-level dielectric layer 5 is deposited preferably by plasma-enhanced chemical vapor deposition using silane or tetraethylorthosilicate (TEOS). Vias 6 are then patterned with a photoresist 7, such as standard Shipley deep-UV and I-line photoresist or other commonly available photoresist. The locations of the vias are set by the design of the semiconductor. Some misalignment is shown in FIG. 1 to better illustrate the invention.

Figure 2:
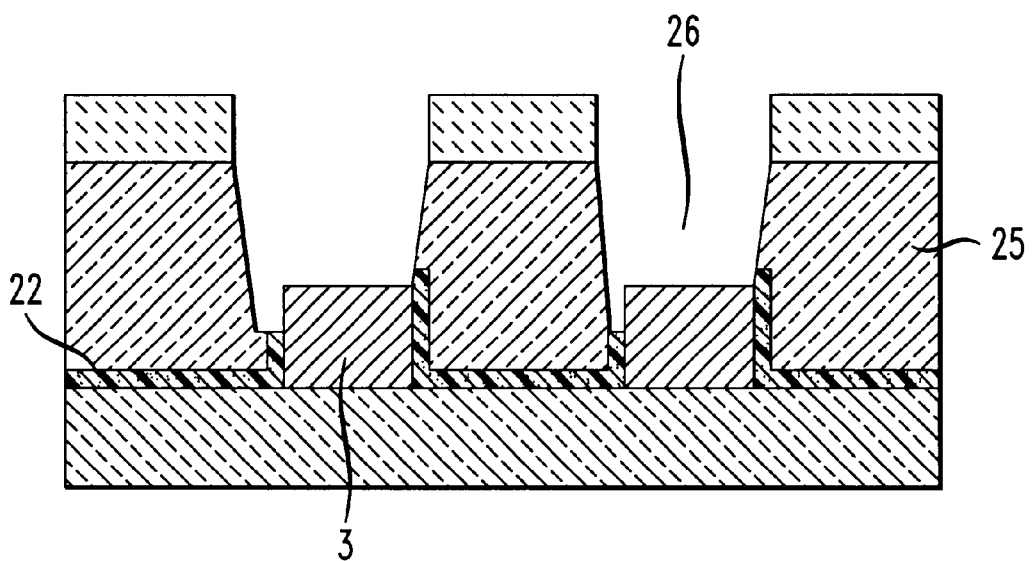
FIG. 2 is cross-sectional view of a portion of the integrated circuit shown in FIG. 1 manufactured in accordance with step 6 of the invention.
Figure 3:
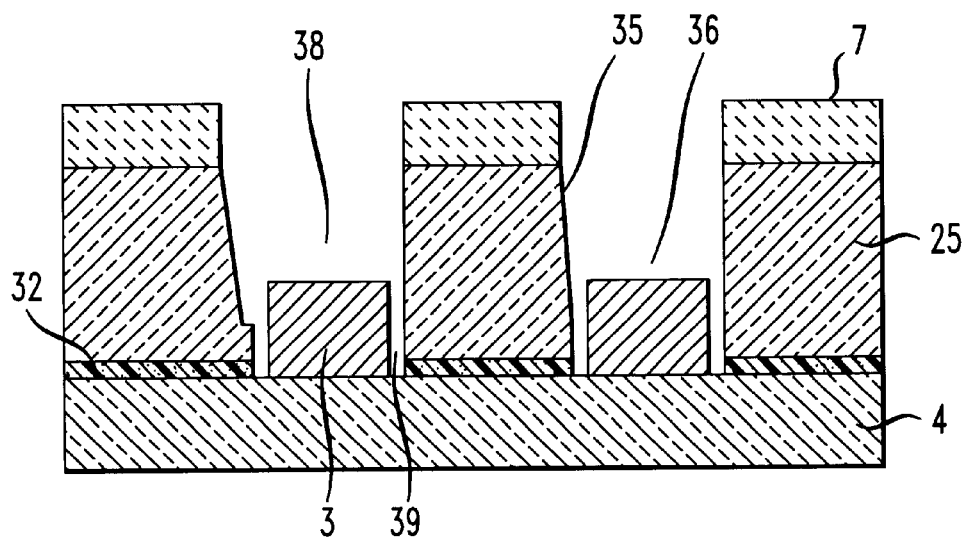
FIG. 3 is a cross-sectional view of a portion of the integrated circuit shown in FIG. 2 manufactured in accordance with step 7 of the invention.

Portions of the second inter-level dielectric layer 5 and portions of the silicon nitride layer 2 above the metal lines 3 are then non-selectively oxide etched. The remaining portions 25 of the second inter-level dielectric layer and remaining portions 22 of the silicon nitride layer are shown in FIG. 2. The non-selective etch is a timed etch. In a subsequent step, silicon nitride layer 22 surrounding metal lines 3 in via 26 is removed by selective nitride-to-oxide etching, that is, a selective etch of silicon nitride layer 22 without etching first inter-level dielectric layer 4. The remaining portions 32 of the silicon nitride layer after the selective etch are shown in FIG. 3. Preferably, the selective etch is performed in a downstream etcher using an $NF_3$/helium gas mixture and the etch is isotropic. In this process, the selectivity of silicon nitride to silicon oxide is about 5 to 1. A typical time for this process is approximately one minute, but the time may vary according to the thickness of nitride layer 22.

The etching stops at the first inter-level dielectric layer 4 and therefore, results in an opening, or area, to tops 38 and openings to sides 39 of the metal lines 3, as shown in FIG. 3. Together, these openings 38 and 39 form an access window to the metal lines 3. The openings to the sides 39 are preferably uniform in size, compared to one another. By etching vias 36 in two steps, consisting of a non-selective oxide etch followed by a nitride selective etch, the openings to sides 39 are made more uniform and the depth of vias 36 is better controlled.

Figure 4:
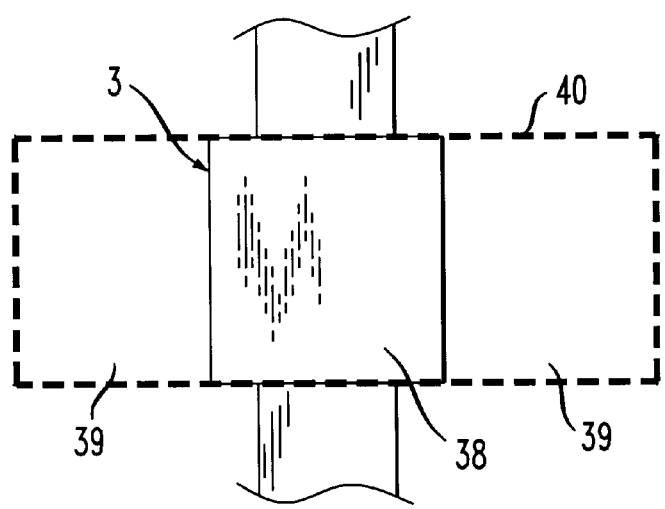
FIG. 4 is a top view of a portion of the integrated circuit shown in FIG. 3.

This method provides a semiconductor having metal lines 3 and portions of a silicon nitride layer 32 formed on first inter-level dielectric layer 4; portions of second inter-level dielectric layer 25 formed on portions of the silicon nitride layer 32; photoresist 7 on portions of the second inter-level dielectric layer 25; and vias 36 defined by sides 35 of portions of second inter-level dielectric layer 25 and by top 38 and sides 39 of the metal lines 3, which form the access window to metal lines 3. The depths of vias 36 are typically less than about 3 μm. FIG. 4 depicts a top view of a portion of the integrated circuit. Access window 40, which incorporates the openings to top 38 and sides 39, preferably extends about 0.26 μm as measured perpendicularly from each side of metal line 3 and preferably has a width of about 0.28 μm. When manufacturing a semiconductor device, the steps described herein may be repeated any hundred of times.

After access window 40 is formed, a programming process may be performed. A dielectric coating, or laser ablative etch resistant coating, may be deposited on access window 40 to cover it, thus filling the via, including openings 38 and 39 surrounding metal lines 3. Portions of the dielectric coating may then be ablated by using a laser to expose portions of metal lines 3. The exposed metal lines 3 are then etched to program a chip. The self-alignment feature, which results from the etching processes, substantially eliminates loss of chip space to overlay alignment errors, so chip density is not decreased.

While the invention has been described with specificity, additional advantages and modifications will readily occur to those skilled in the art. Therefore, the invention in its broader aspects is not limited to the specific details shown and described herein. Accordingly, various modifications may be made without departing from the spirit or scope of the general inventive concept as defined by the appended claims and their equivalents. For example, different materials may be used for inter-level dielectric layers and different methods may be used to program a chip.

What is claimed is:

1. A method of manufacturing an integrated circuit comprising:

a. providing a first inter-level dielectric layer having metal lines formed thereon;

b. depositing a silicon nitride layer over said metal lines and first inter-level dielectric layer;

c. depositing a second inter-level dielectric layer on said silicon nitride layer;

d. depositing a photoresist on said second inter-level dielectric layer;

e. patterning vias on said second inter-level dielectric layer;

f. non-selectively oxide etching said second inter-level dielectric layer and said silicon nitride layer to form said vias; and g. selectively nitride-to-oxide etching said silicon nitride layer to remove said silicon nitride layer surrounding said metal lines, wherein said etching stops at said first inter-level dielectric layer, thereby forming an access window.

2. The method of claim 1 further comprising:

h. depositing a dielectric coating through said access window filling said via, including areas surrounding said metal lines;

i. ablating selected portions of said coating to expose selected portions of said metal lines; and j. etching said exposed metal line portions to program said circuit.

3. The method of claim 1 wherein said metal lines are comprised of a metal selected from the group consisting of aluminum, copper, aluminum alloys, copper alloys, titanium, titanium alloys, and mixtures thereof.

4. The method of claim 1 wherein said first inter-level dielectric layer is comprised of silicon dioxide.

5. The method of claim 1 wherein said second inter-level dielectric layer is comprised of silicon dioxide.

6. The method of claim 1 wherein said silicon nitride layer is deposited by plasma-enhanced chemical vapor deposition.

7. The method of claim 1 wherein said openings to said sides are uniform.

8. The method of claim 1 wherein said nitride-to-oxide etching is performed in a downstream etcher.

9. The method of claim 1 wherein said silicon nitride layer is etched with an $NF_3$/helium gas mixture.

10. The method of claim 1 wherein said access window extends about 0.26 µm on each side of said metal lines.

11. The method of claim 1 wherein said access window has a width of about 0.28 µm.

12. The method of claim 1 wherein said via has a depth of about 3 µm.

13. The method of claim 1 wherein said second inter-level dielectric is chemical mechanical polished after deposition.

14. A method of manufacturing an integrated circuit comprising:

a. providing a first silicon dioxide layer having aluminum, titanium nitride stacks formed thereon;

b. depositing a silicon nitride layer over said aluminum, titanium nitride stacks and first silicon dioxide layer;

c. depositing a second silicon dioxide layer on said silicon nitride layer;

d. depositing a photoresist on said second silicon dioxide layer;

e. patterning vias on said second silicon dioxide layer;

f non-selectively oxide etching said silicon dioxide layer and said silicon nitride layer; and g. selectively nitride-to-oxide etching said silicon nitride layer to remove said silicon nitride layer surrounding said metal lines, wherein said etching stops at said first silicon dioxide layer, thereby forming an access window.

* * * * *